(12) United States Patent
Rohr

(10) Patent No.: US 7,233,515 B2
(45) Date of Patent: Jun. 19, 2007

(54) INTEGRATED MEMORY ARRANGEMENT BASED ON RESISTIVE MEMORY CELLS AND PRODUCTION METHOD

(75) Inventor: Thomas Rohr, Aschheim (DE)

(73) Assignee: Infineon Technologies AG, Munich (DE)

( * ) Notice: Subject to any disclaimer, the term of this patent is extended or adjusted under 35 U.S.C. 154(b) by 104 days.

(21) Appl. No.: 11/209,977

(22) Filed: Aug. 23, 2005

(65) Prior Publication Data
US 2006/0050545 A1 Mar. 9, 2006

(30) Foreign Application Priority Data
Aug. 23, 2004 (DE) .............. 10 2004 040 752

(51) Int. Cl.
*G11C 11/00* (2006.01)

(52) U.S. Cl. .............. 365/148; 365/158; 365/163; 365/149; 257/386; 327/382

(58) Field of Classification Search .............. 365/148, 365/149, 158, 163; 257/386; 327/382
See application file for complete search history.

(56) References Cited

U.S. PATENT DOCUMENTS

| 6,504,214 B1* | 1/2003 | Yu et al. .............. 257/347 |
| 6,906,548 B1* | 6/2005 | Toshiyuki et al. .......... 324/769 |
| 2006/0166455 A1* | 7/2006 | Gordon et al. .............. 438/385 |

* cited by examiner

*Primary Examiner*—Son Dinh
*Assistant Examiner*—Eric J. Wendler
(74) *Attorney, Agent, or Firm*—Dicke, Billig & Czaja, PLLC

(57) ABSTRACT

An integrated memory arrangement based on resistive memory cells that can be changed over between a first state of high electrical resistance and a second state of low electrical resistance, each memory cell having an electrical additional capacitance that increases its capacitance, and to a production method.

27 Claims, 10 Drawing Sheets

Typ A

Typ A

Typ B

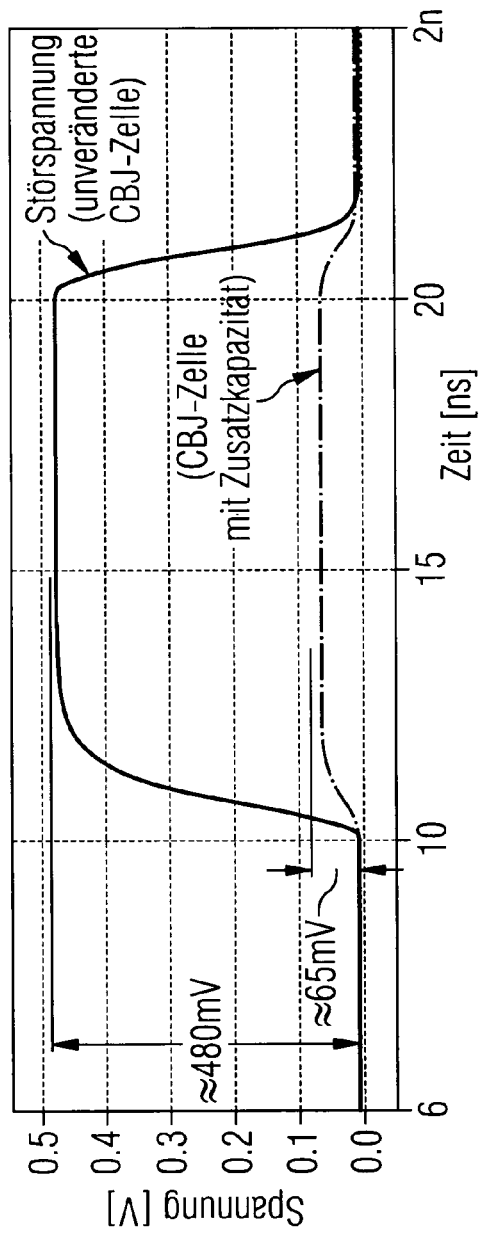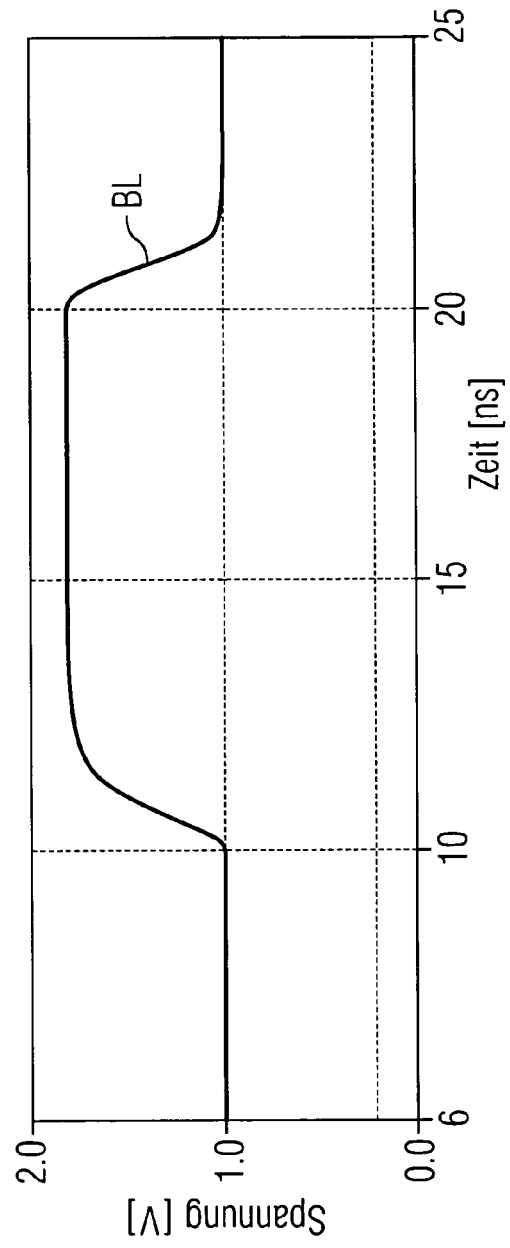

FIG 6A
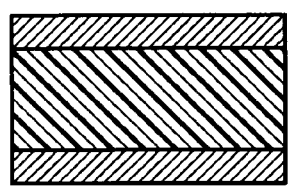
CBJ (unverändert)
FIG 6B
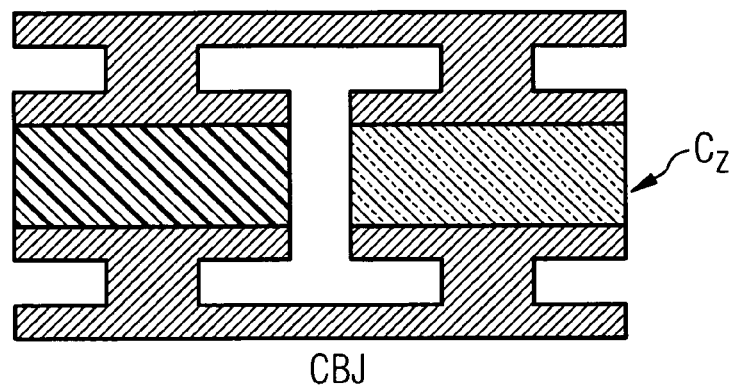
CBJ
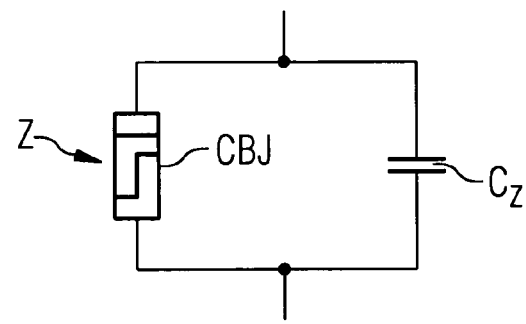

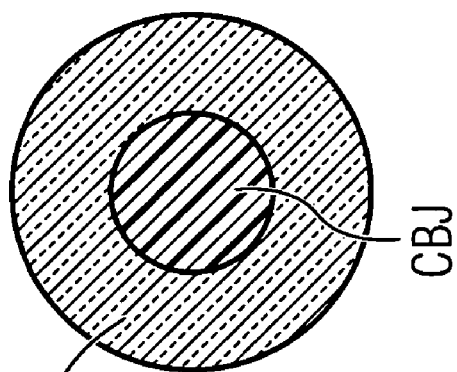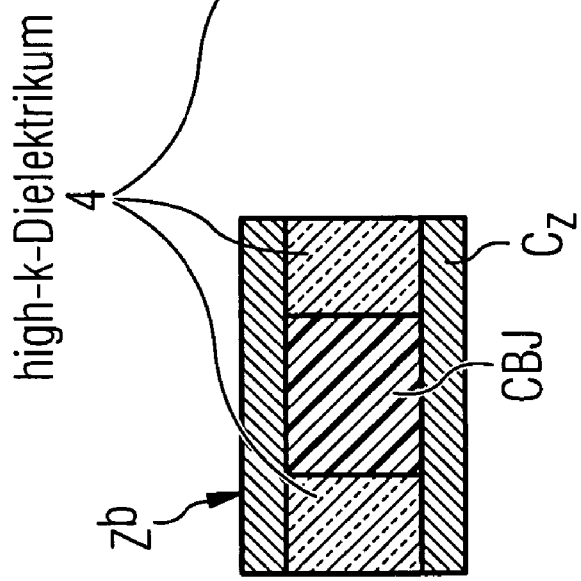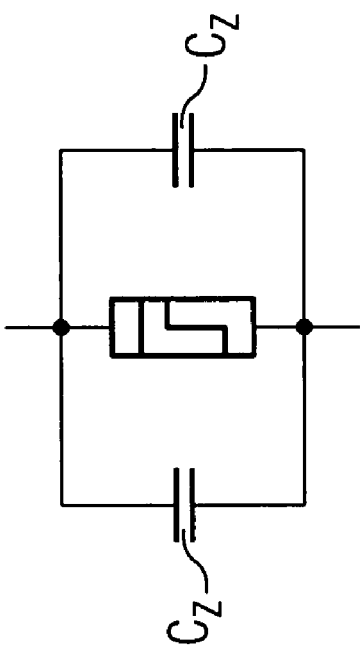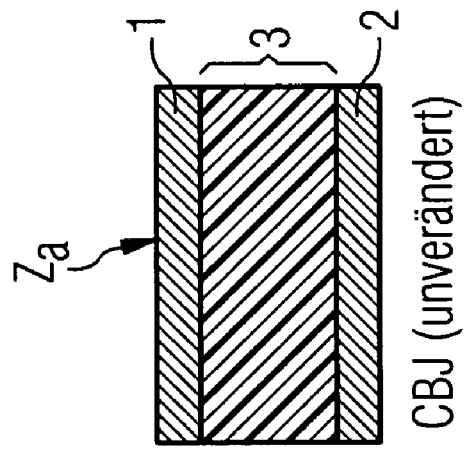

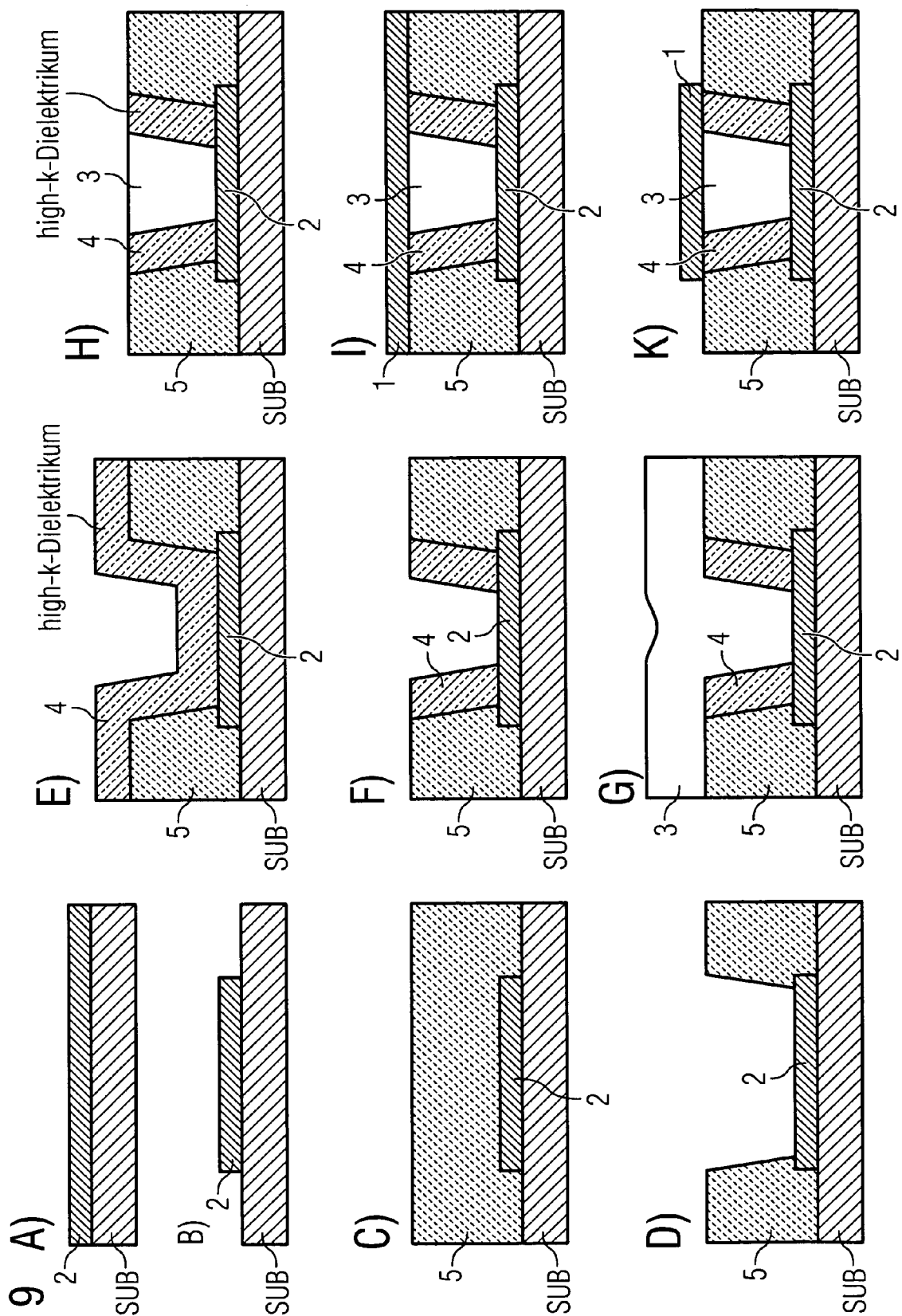

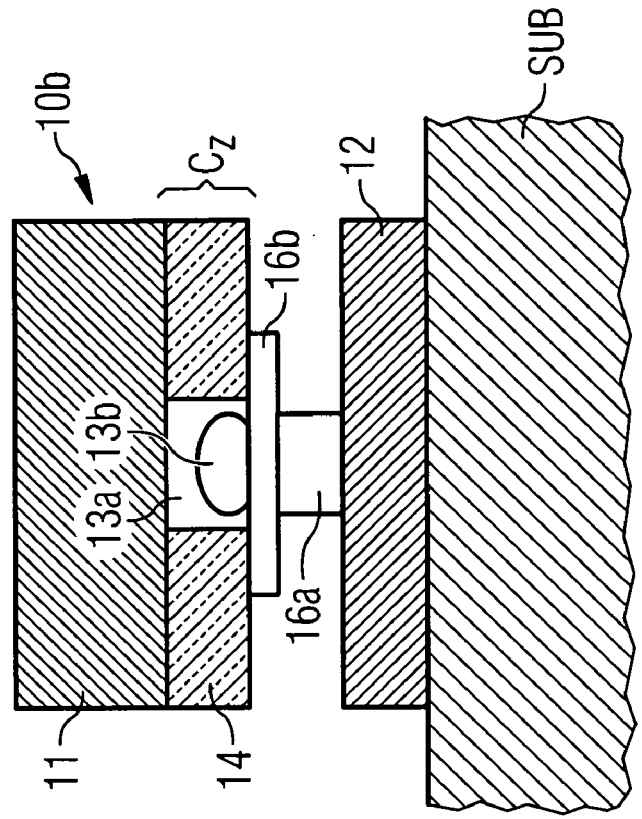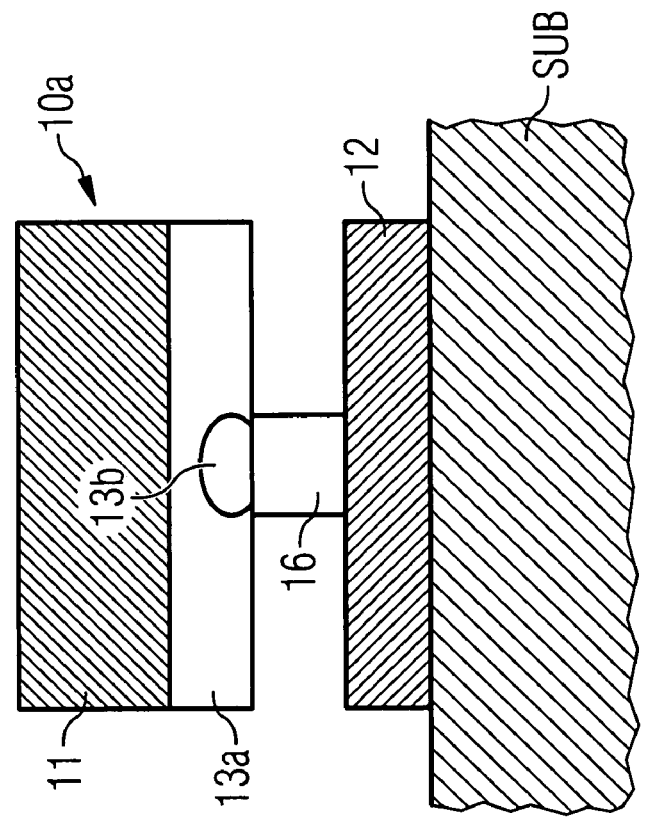

US 7,233,515 B2

INTEGRATED MEMORY ARRANGEMENT BASED ON RESISTIVE MEMORY CELLS AND PRODUCTION METHOD

CROSS-REFERENCE TO RELATED APPLICATIONS

This Utility Patent Application claims priority to German Patent Application No. DE 10 2004 040 752.5, filed on Aug. 23, 2004, which is incorporated herein by reference.

FIELD OF THE INVENTION

The invention relates to an integrated memory arrangement based on resistive memory cells which can be changed over between a first state of high electrical resistance and a second state of low electrical resistance, and to a production method.

BACKGROUND

Resistive memories use a memory element that can change the electrical resistance through suitable programming. Possible representatives are, for instance, MRAM, phase change RAM or conductive bridging ram (CBRAM). In this case, the resistance ratio between the two switching states may amount to a few 10%, such as in the case of MRAM for instance, or many orders of magnitude, such as in the case of CBRAM, which is discussed in detail below by way of example. In the OFF state, a CB contact (CBJ, conductive bridging junction) has a resistance of $10^{10} \ldots 10^{11}$ Ω, which is of the same order to magnitude as the OFF state of a FET that is typically used as a switching element is semiconductor circuits. The consequence of the extreme high-resistance nature of the CBJ is that turned-off nodes between a CBJ and a selection transistor are practically totally electrically isolated and are thus very sensitive to interference voltages. At the same time, by way of example, a CB contact can be changed over from the high-resistance state to the low-resistance state by the application of a voltage, that is to say that this may also occur unintentionally as a result of the occurrence of interference voltages.

Capacitive coupling effects are dominant at electrically isolated nodes. The ratio of the parasitic capacitances of the switching element and the surrounding circuit determines the magnitude of the interference voltages that occur. A specific charge Q is involved in the case of such capacitive coupling in of interference voltages. In accordance with the capacitor equation C equals Q/U, the voltage U that results when a capacitance C is charged with a constant quantity of charge is proportional to the reciprocal of the capacitance C. The greater the capacitance, the lower the voltage U occurring across the capacitance C. In order that interference voltages coupled in capacitively are kept as small as possible, it is accordingly desirable to increase the capacitance of the switching element in the memory cell.

SUMMARY

In one embodiment, the present invention provides an integrated memory arrangement based on resistive memory cells that can be changed over between a first state of high electrical resistance and a second state of low electrical resistance, each memory cell having an electrical additional capacitance that increases its capacitance, and to a production method.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 5A and 5B illustrate simulated responses of a CBJ cell of type A to the coupling in of an interference voltage onto the bit line BL.

FIGS. 6A and 6B illustrate schematic cross sections respectively through an unchanged CBJ memory cell and one exemplary embodiment of the invention, in which the capacitance of the memory cell is increased by connecting an additional capacitance in parallel.

FIGS. 8A and 8B respectively illustrate, as schematic cross-sectional views, an unchanged CBJ memory cell and a CBJ memory cell which corresponds to a fourth exemplary embodiment and in which the additional capacitance is integrated in the memory cell.

FIG. 8C illustrates a plan view of the CBJ memory cell corresponding to the fourth exemplary embodiment in accordance with FIG. 8B.

FIG. 9A–9I, and FIG. 9K respectively illustrate, in the form of schematic cross sectional views, individual process steps of a preferred method for producing a CBJ memory cell corresponding to the fourth exemplary embodiment.

FIGS. 10A and 10B illustrate, in the form of schematic cross-sectional views, an unchanged PCRAM memory cell and a PCRAM memory cell with an additional capacitance integrated according to the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described.

Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention operates to suppress the capacitive coupling in occurring at resistive memory cells that have a very high resistance by increasing the capacitance of the memory cell, and thereby to increase the interference immunity and to avoid a loss of data through undesired programming.

In one embodiment, the increase in the capacitance of the memory cell can be achieved by connecting a capacitor in parallel or by increasing the capacitance of the memory cell itself.

In one embodiment of the invention, in the case of an integrated memory arrangement, by virtue of the fact that each memory cell has an electrical additional capacitance.

In another embodiment, the present invention provides a method for producing an integrated memory arrangement based on resistive memory cells, in which case, in order to increase the cell capacitance of the resistive memory cells, an electrical additional capacitance is integrated with respect to each memory cell.

Claims dependent thereon in each case characterize advantageous embodiments thereof.

Before individual exemplary embodiments of resistive memory cells according to the invention and of a preferred production method are described below, the fundamental structure of a CBJ memory cell, the latter's switching mechanism, circuit types and its reaction to coupled-in interference voltage pulses are respectively described by way of example with reference to accompanying FIGS. 1 to 5.

Figure 1A:
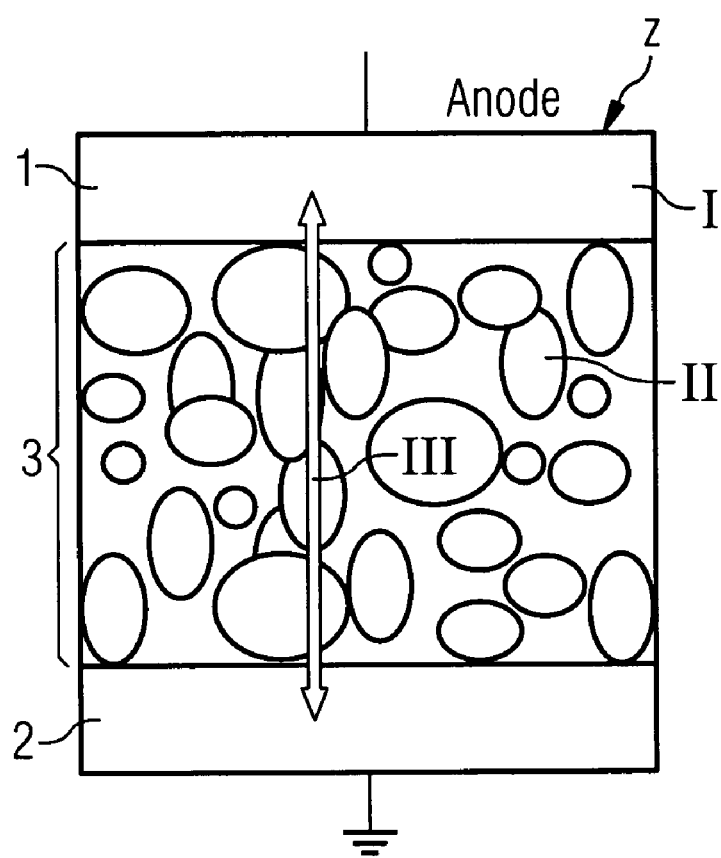
FIGS. 1A and 1B respectively illustrate a schematic cross section for elucidating the physical processes and the fundamental construction of a CBJ memory cell and also the circuit symbol.
Figure 1B:
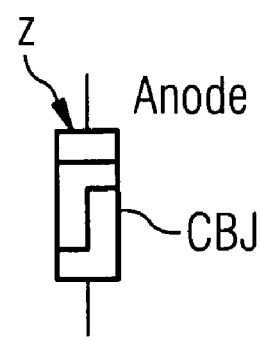

The construction of a CBJ memory cell (CBJ=Conductive Bridging Junction) is illustrated in schematic cross section in FIG. 1A. CBRAM technology will be discussed here by way of example for resistive memory technologies. An insulating chalcogenide glass 3 (e.g., GeSe) into which readily mobile metal ions (e.g., (silver) have been indiffused (e.g., by photodiffusion) is situated between a bottom inert cathode 2 (e.g., tungsten) and a top active anode 1 (e.g., silver). Conductive regions with high metal concentration are thereby formed in the chalcogenide glass layer 3, regions initially still being electrically insulated from one another in the carrier material. In the event of writing, as a result of the application of a positive voltage at the anode 1, further metal ions are generated by a redox reaction (state I), which metal ions are attached to the metal islands already present in the chalcogenide glass 3 (state II) and finally produce a conductive path between the electrodes 1 and 2 (state III). For erasure, this path is cleared away again by the application of a negative voltage, and the electrodes 1, 2 are insulated from one another again. The change in resistance amounts to many orders of magnitude in this case. The polarity of the CBJ cell is crucial when used in electrical circuits. In the case of the circuit symbol of the CBJ cell as illustrated in FIG. 1B, the anode side is identified by a thick bar.

Figure 2A:
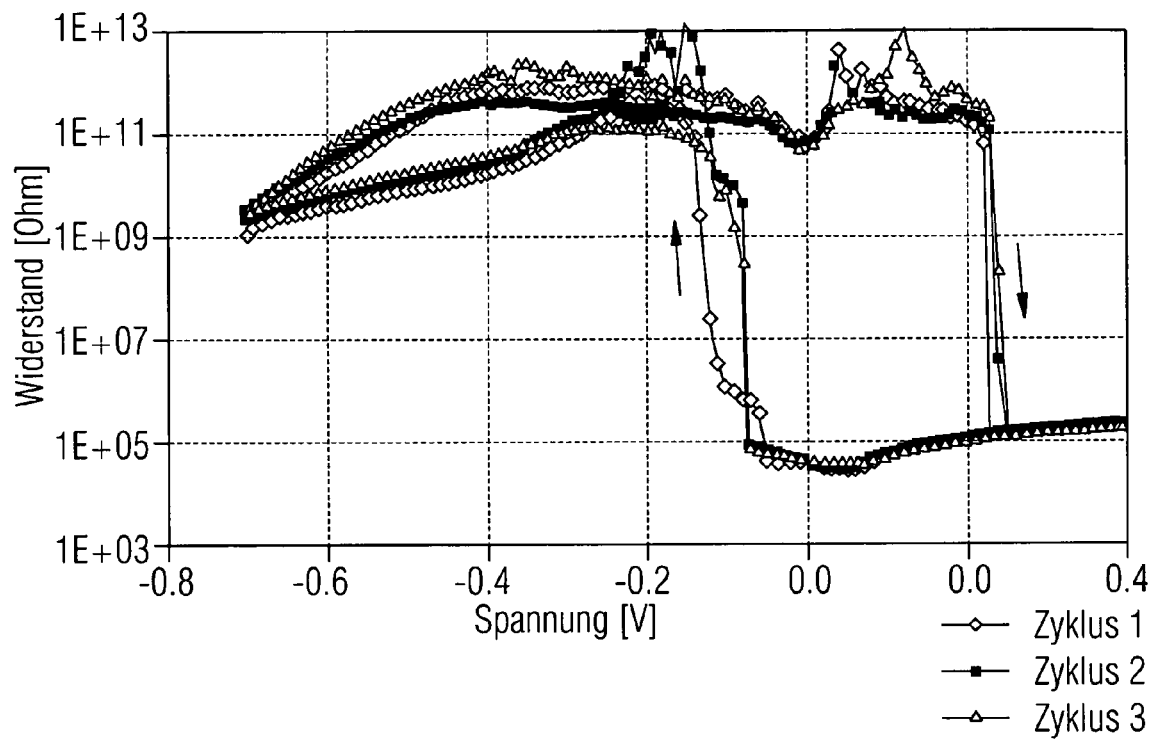
FIGS. 2A and 2B graphically illustrate switching behavior of a CBJ memory cell.
Figure 2B:
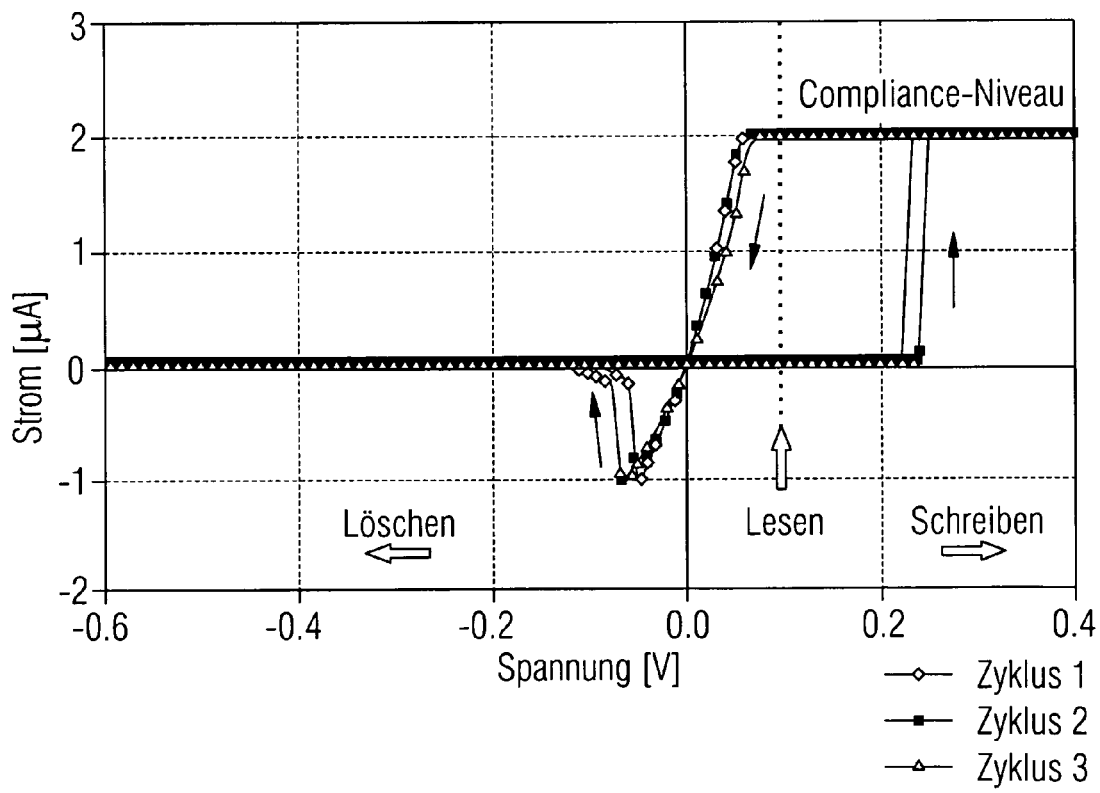

FIGS. 2A and 2B graphically illustrate one embodiment of a typical switching characteristic of a CBJ cell in the form of its change in resistance (FIG. 2A) and the current flowing in the event of switching (FIG. 2B), as a function of the applied voltage. In the initial state, the cell has very high resistance (off resistance in the range of $10^{10}$ $14$ $10^{11}$ $\Omega$). When a positive voltage is applied to the anode, the resistance initially does not change, until it decreases abruptly at a threshold voltage (in the example at approximately 220 mV). By limiting the current (FIG. 2B) to an acceptable value, destruction of the cell by an excessively high current intensity is avoided (compliance level approximately 2 µa). A corresponding resistance value is established depending on the level of the write current. In the typical characteristic curve illustrated, the on resistance is approximately $10^5$ $\Omega$. When a negative voltage is applied to the anode, the cell switches back to the high-resistance state, and the current flow stops again (at approximately −50 mV in the example illustrated). A certain level and duration of the applied erase voltage pulse after the changeover to the high-resistance state are necessary in order to obtain defined initial conditions for a subsequent write operation. The cell is read in the positive voltage range below the writing threshold voltage (e.g. at 100 mV). At this operating point, the current through the cell is dependent on the cell resistance and can assume two different values.

Figure 3A:
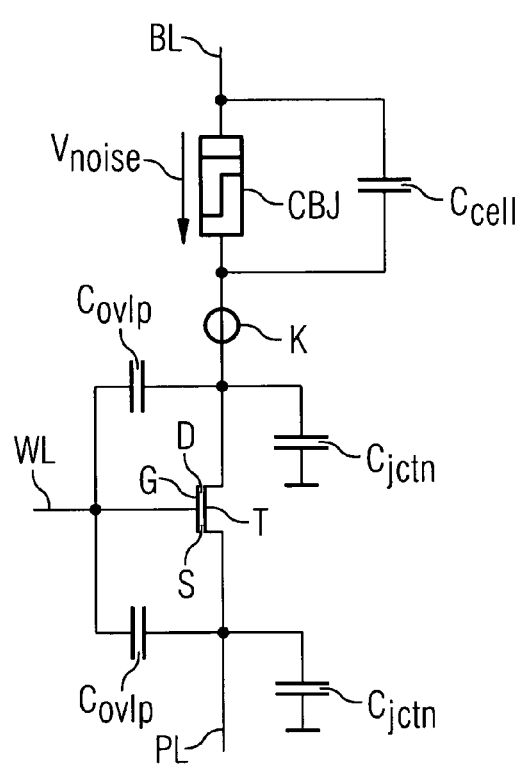
FIGS. 3A and 3B illustrate circuit diagrams respectively of a basic circuit type A and a basic circuit type B of a CBJ memory cell in combination with a drive or selection transistor and the parasitic capacitances that occur in this case.
Figure 3B:
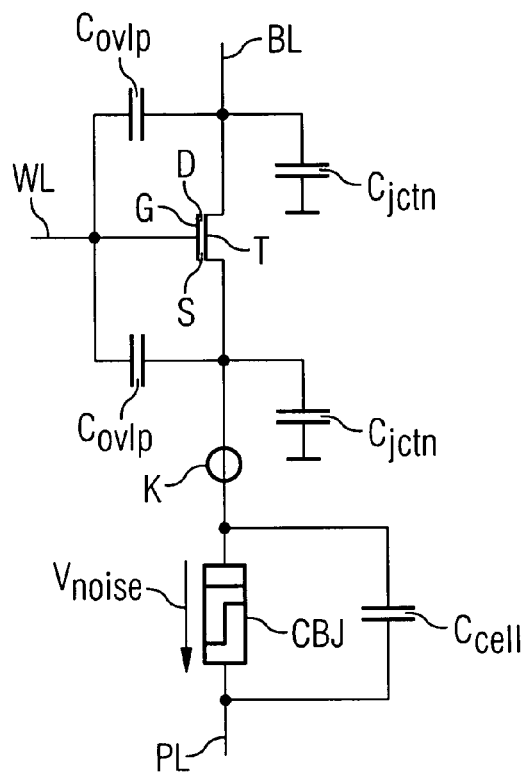

FIGS. 3A and 3B illustrate the parasitic capacitances, to be precise in two different circuit types A and B of a CBJ cell in combination with a field effect transistor T serving as a selection transistor. The contact capacitance Cjctn (junction capacitance) and the overlap capacitance Covlp are primarily to be taken into account in the case of the field effect transistor T. The parasitic capacitance Ccell of the CBJ cell results from the geometry and the dielectric constant of the insulator used. In the case of one technology that is customary at the present time (110 nm contact size), the parasitic capacitances of the transistor T together produce a value of 0.05 fF, and the parasitic capacitance Ccell of the CBJ cell has approximately the same magnitude. This means that a significant portion of an applied interference pulse occurs at the common node K of a capacitive voltage divider.

Figure 4A:
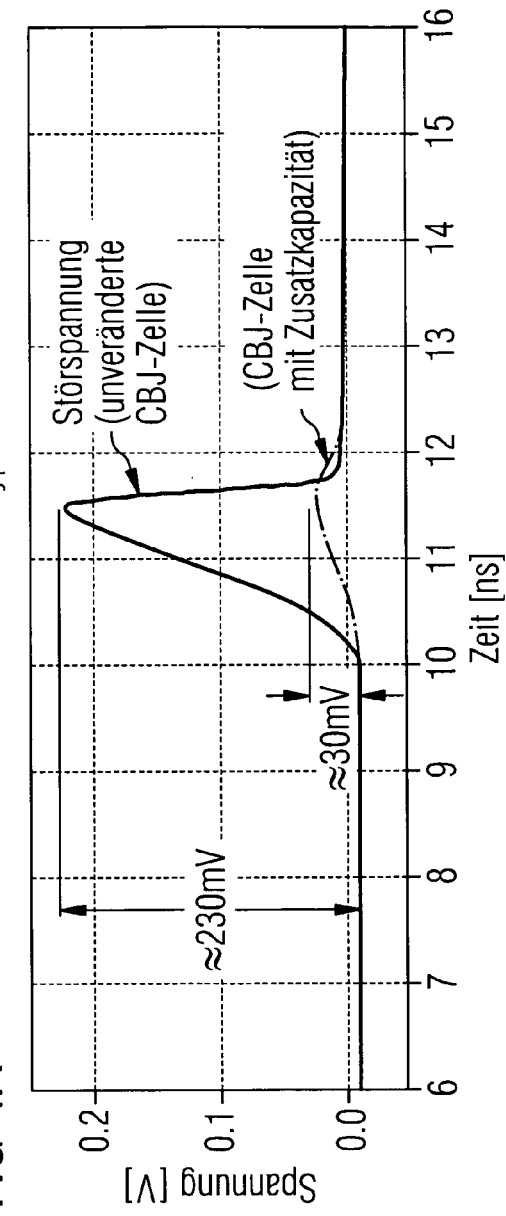
FIGS. 4A and 4B graphically illustrate a simulated response of the CBJ cell to word line interference voltages in the case of the CBJ basic circuit type B.
Figure 4B:
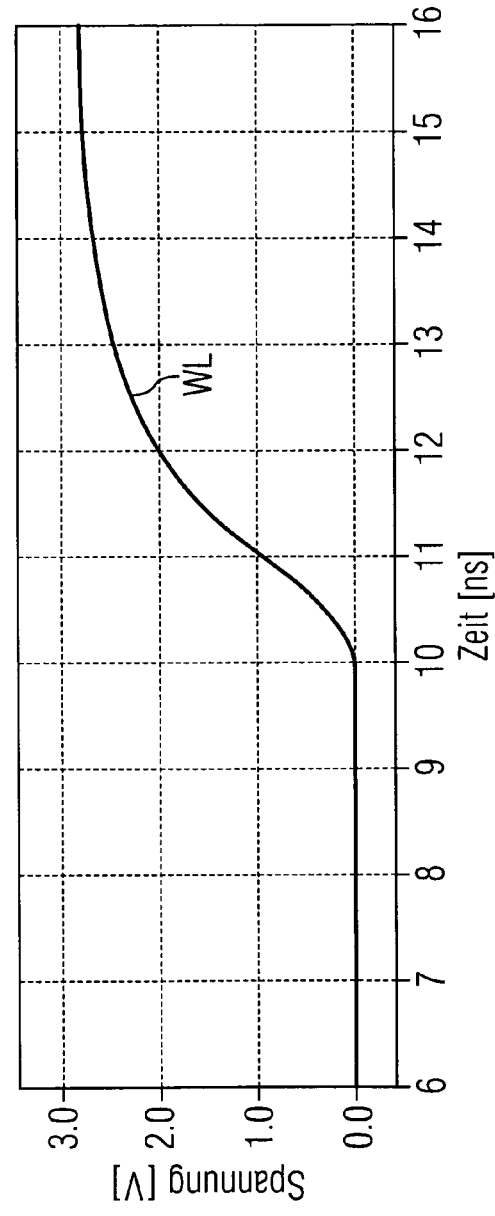

In one embodiment, in order to examine the effects more precisely, circuit simulations were carried out, the results of which are illustrated in FIGS. 4A, 4B and 5A, 5B. In the first embodiment (FIG. 4B), a voltage pulse is applied to the gate terminal of the transistor T, that is to say to the word line WL. This happens each time the cell is accessed. The voltage pulse couples in at the common node K essentially via the overlap capacitance Covlp of the transistor T. The circuit type B is under consideration here. Upon the rising edge of the voltage pulse at the gate, a positive interference voltage pulse is produced across the CBJ cell (FIG. 4A). If this interference voltage exceeds the threshold value for programming, there is the risk of the cell being changed over to the on state in an undesired manner. With the assumed capacitance values of an unchanged CBJ cell, an interference voltage of approximately 230 mV results, which, under certain circumstances, lies above the writing threshold (FIG. 4A). By means of the additional capacitance proposed according to the invention, which, in the case of the simulation in accordance with FIG. 4A, has a value approximately ten times that of the cell capacitance itself, the interference pulse is lowered to approximately 30 mV and is thus unproblematic.

In the second case (FIG. 5B) a voltage pulse is applied to the bit line BL. The word line WL is not selected and the transistor T is thus turned off. This corresponds to writing to a different cell connected to the same bit line BL. The CBJ cell of circuit type A is under consideration here. The voltage swing on the bit line BL is approximately 800 mV, and an interference voltage of approximately 480 mV is produced across the memory cell CBJ, said interference voltage lying far above the writing threshold of the CBJ cell. In this case, too, according to the invention, by connecting in an additional capacitance, said interference voltage is lowered significantly, to approximately 65 mV in the example, and thus becomes harmless.

Figure 7A:
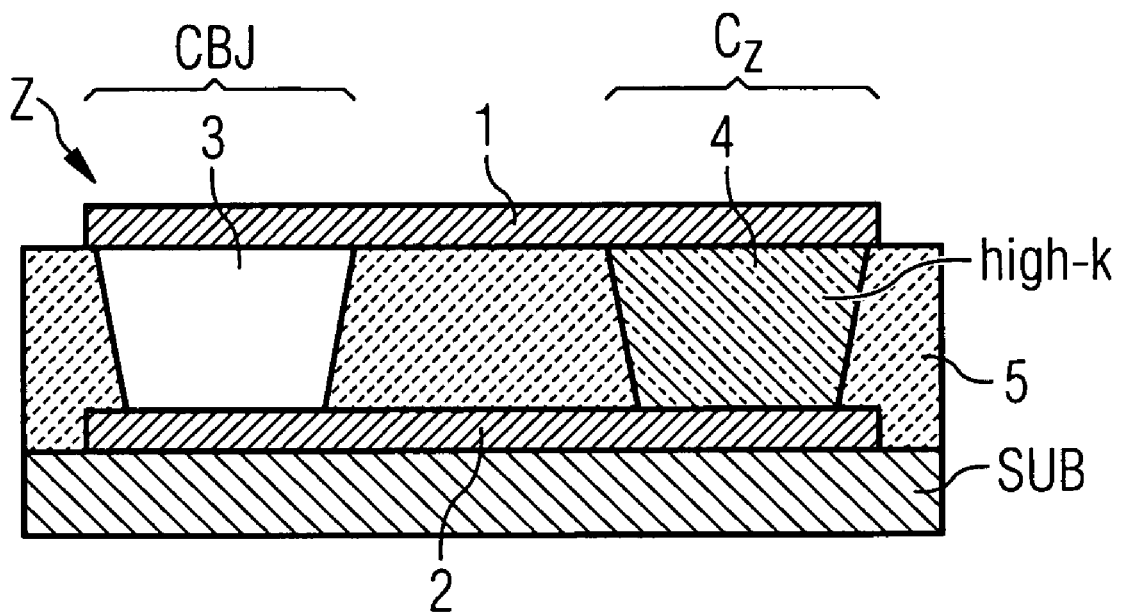
FIGS. 7A and 7B respectively illustrate a schematic cross-sectional view of a second and third exemplary embodiment of a CBJ memory cell with which an additional capacitance is connected in parallel in order to increase its cell capacitance.

FIGS. 6A and 6B schematically illustrate for comparison a cross section through respectively an unchanged CBJ cell and a first exemplary embodiment of the invention formed by connecting an additional capacitance Cz in parallel with the CBJ cell. The lower part of FIG. 6B illustrates the equivalent circuit diagram therefor. Such an additional capacitance Cz can be implemented in the manner illustrated in FIGS. 7A and 7B, which schematically illustrates a second and third exemplary embodiment of the invention. Lying above a substrate SUB is a bottom electrode 2, above that an insulator layer 5, and a top electrode (anode) 1 above the insulator layer. The bottom electrode 2 and the anode 1 are widened. Laterally with respect to the chalcogenide 3 that forms the active region, a region 4 having a very high dielectric constant (high-k material) is introduced between the anode 1 and the bottom electrode 2, so that the additional capacitor Cz is implemented at this location.

Figure 7B:
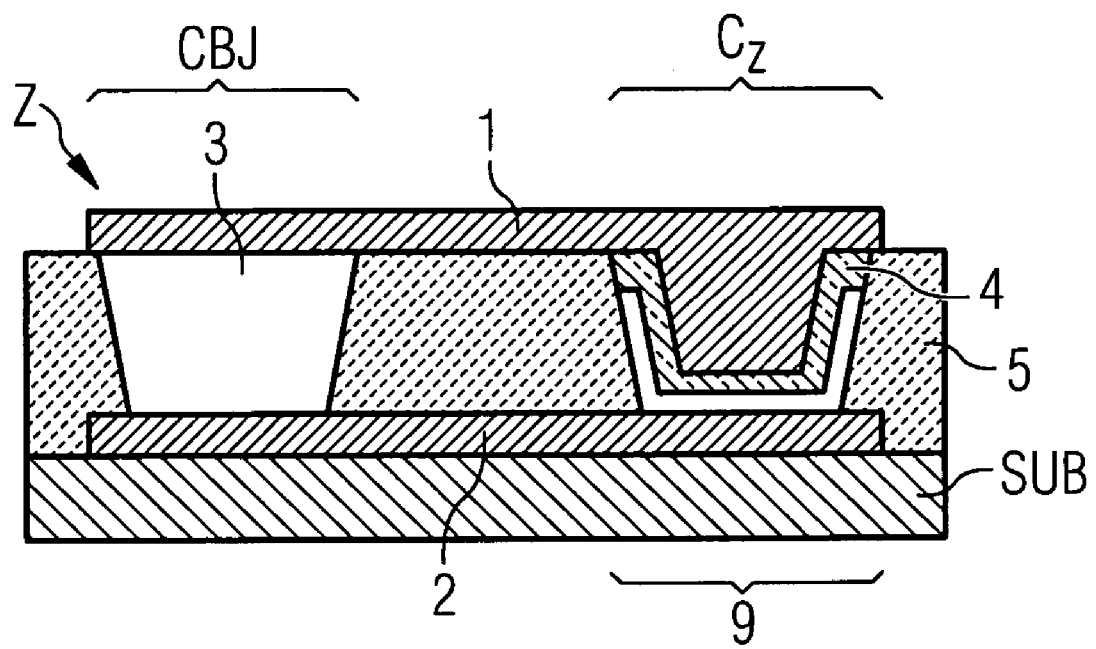

In another embodiment, in accordance with FIG. 7B, the additional capacitance Cz is implemented in a contact which is adjacent to the CBJ cell Z and which may have a dielectric 4 having a very high dielectric constant and, as illustrated in FIG. 7B, a special electrode form for increasing the surface area. The additional capacitance Cz could equally be embodied as a gate oxide capacitance or as a capacitance between two metal layers.

In one embodiment, the additional capacitance is integrated directly into the CBJ cell. This enables chip area to be saved. The capacitance of the CBJ cell can be increased by enlarging the area thereof or reducing its thickness or increasing the dielectric constant of the chalcogenide material, insofar as this is compatible with the switching effect of the CBJ cell.

FIG. 8A–8C illustrate a further embodiment of integrating the additional capacitance Cz into the CBJ cell. Firstly, FIG. 8A once again illustrates the unchanged cell Za. As mentioned, a quasi one-dimensional conductive path is formed in the CBJ cell, so that the cross section of the cell can be reduced without impairing the switching function. This is exploited by the fourth exemplary embodiment of the invention as illustrated in FIG. 8B in that part of the cross section of the CBJ cell Zb is filled by a dielectric 4 having a higher dielectric constant and the total capacitance with memory geometry is thus increased. FIG. 8C schematically illustrates a plan view of the fourth exemplary embodiment illustrated in cross section in FIG. 8D. The cell need not, of course, be circular or cylindrical but rather may also have a square or rectangular form.

The process steps A–K in FIG. 9 schematically illustrate how such a cell in accordance with FIGS. 8B and 8C can be produced in a so-called spacer process: At A, the material of the bottom electrode 2 is deposited on a substrate; at B, the bottom electrode 2 is patterned and, in accordance with C, an insulating intermediate oxide 5 is deposited above it. In accordance with D, a contact hole is formed through the intermediate oxide 5 as far as the bottom electrode 2. In accordance with E, a material of a dielectric 4 having a high dielectric constant is deposited conformally and, in accordance with F, etched back anisotropically, so that the bottom electrode 2 is uncovered. Afterward, filling with the dielectric 3 (chalcogenide) of the CBJ cell is effected (G) and, in accordance with H, the dielectric 3 is etched back and the surface is polished. Afterward, the material of the top electrode 1 is deposited in accordance with I and patterned in accordance with K.

Embodiments of an integrated memory arrangement according to the invention based on CBJ memory cells and a production method therefor have been described.

However, the invention can also be applied to other resistive memory cells. FIGS. 10A and 10B respectively illustrate a schematic cross section through an unchanged PCRAM memory cell 10a and a modified PCRAM memory cell 10b with an integrated additional capacitance Cz according to the invention. In order to integrate the additional capacitance Cz into the memory cell 10b, the diameter of the active layer 13a, 13b is reduced and a dielectric 14 having a high dielectric constant is integrated instead. In addition, the zone 16a called "heater" above the bottom electrode 12 undergoes a widening 16b, which, with the intervening high-k dielectric layer 14 and the top electrode 11, forms the additional capacitance Cz.

The above description describes various exemplary embodiments by means of which the capacitance of resistive memory cells can be increased by connecting a capacitor in parallel or by increasing the capacitance of the memory cell itself and capacitive coupling in can thus be suppressed, the interference immunity can be increased and loss of data due to undesired programming can be avoided.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated memory arrangement comprising:
 a plurality of resistive memory cells configured to be changed over between a first state of high electrical resistance and a second state of low electrical resistance, each memory cell having a first capacitance; and
 an electrical additional capacitance associated with each memory cell that increases the capacitance of the memory cell.

2. The memory arrangement of claim 1, comprising wherein the additional capacitance includes a capacitor connected in parallel with the memory cell.

3. The memory arrangement of claim 1, comprising wherein the additional capacitance includes a contact capacitance formed in a contact adjacent to the memory cell.

4. The memory arrangement of claim 1, comprising wherein the additional capacitance integrated directly into the memory cell.

5. The memory arrangement of claim 1, comprising wherein the memory arrangement is a CBRAM, in which the resistive memory cells are in each case conductive bridging junction contact junctions.

6. The memory arrangement of claim 1, comprising wherein the memory arrangement is a PCRAM, in which the memory cells have an active layer made of a material with a changeable phase state.

7. The memory arrangement of claim 1, comprising wherein it is an MRAM.

8. The memory arrangement of claim 4, comprising wherein the additional capacitance is implemented in the memory cell by increasing an electrode area of the memory cell.

9. The integrated memory arrangement as claimed in claim 4, wherein the additional capacitance is implemented in the memory cell by reducing its electrode spacing.

10. The memory arrangement of claim 4, wherein the additional capacitance is implemented by increasing a dielectric constant of an active layer lying between the electrodes of the memory cell.

11. The memory arrangement of claim 4, comprising wherein part of a cross section of the memory cell is filled by a dielectric having a higher dielectric constant than a dielectric constant of an active layer between the electrodes.

12. A method for producing an integrated memory arrangement comprising:
   forming a plurality of resistive memory cells having a cell capacitance; and
   increasing the cell capacitance of the resistive memory cells, including integrating an electrical additional capacitance with respect to each memory cell.

13. The method of claim 12, comprising:
   forming the additional capacitance by connecting a capacitor in parallel with the memory cell.

14. The method of claim 12, comprising:
   forming the additional capacitance by a contact capacitance in a contact adjacent to the memory cell.

15. The method of claim 12, comprising:
   integrating the additional capacitance directly into the memory cell.

16. The method of claim 12, comprising:
   using the method to produce a CBRAM with CBJ memory cells.

17. The method of claim 12, comprising:
   using the method for producing a PCRAM memory.

18. The method of claim 12, comprising:
   using the method for producing an MRAM memory.

19. The method of claim 15, comprising:
   implementing the additional capacitance by increasing the electrode area in the memory cell.

20. The method of claim 15, comprising:
   implementing the additional capacitance by reducing the electrode spacing in the memory.

21. The method of claim 15, comprising:
   implementing the additional capacitance by increasing the dielectric constant of an active layer lying between the electrodes of the memory cell.

22. The method of claim 15, comprising:
   forming the additional capacitance by filling part of a cross section of the memory cell with a dielectric having a higher dielectric constant than that of an active layer lying between the electrodes of the memory cell.

23. An integrated memory arrangement comprising:
   a plurality of resistive memory cells configured to be changed over between a first state of high electrical resistance and a second state of low electrical resistance, each memory cell having a first capacitance; and
   means for providing an electrical additional capacitance associated with each memory cell that increases the capacitance of the memory cell.

24. The memory arrangement of claim 23, comprising wherein the means for providing an additional capacitance includes a capacitor connected in parallel with the memory cell.

25. A random access memory cell comprising:
   a top electrode;
   a bottom electrode;
   an insulator layer positioned between the top electrode and the bottom electrode;
   an active region formed in the insulator layer;
   a dielectric region having very high dielectric constant is formed in the insulator layer, between the top electrode and the bottom electrode; providing an additional capacitor to the memory cell and increasing the capacitance of the memory cell.

26. The memory cell of claim 25, comprising:
   wherein the dielectric region is made of a high-k material.

27. The memory cell of claim 26, wherein the active region is made of a chalcogenide material.

* * * * *